United States Patent [19]
van der Burgt et al.

[11] 4,034,241
[45] July 5, 1977

[54] VOLTAGE SENSITIVE TRIGGER CIRCUIT

[75] Inventors: Cornelis Martinus van der Burgt; Gerardus Andreas Van Maanen, both of Eindhoven, Netherlands

[73] Assignee: U.S. Philips Corporation, New York, N.Y.

[22] Filed: May 17, 1976

[21] Appl. No.: 686,998

Related U.S. Application Data

[63] Continuation of Ser. No. 574,511, May 5, 1975, abandoned.

[30] Foreign Application Priority Data

May 21, 1974 Netherlands ..................... 7406785

[52] U.S. Cl. ............................. 307/264; 307/273; 307/310; 307/359
[51] Int. Cl.² ..................... H03K 1/02; H03K 1/14
[58] Field of Search .......... 307/235 K, 235 T, 276, 307/264, 310

[56] References Cited
UNITED STATES PATENTS 3,469,116  9/1969  Nomura ............................. 307/273
3,854,058 12/1974  Nye, Jr. et al. ................. 307/310 X

*Primary Examiner*—John Zazworsky
*Attorney, Agent, or Firm*—Frank R. Trifari; Bernard Franzblau

[57] ABSTRACT

A voltage sensitive trigger circuit with a threshold which must be temperature and supply-voltage independent. To this end, a preamplifier is employed which in itself is not only provided with negative feedback but which also receives a current which is derived from that trigger transistor, which in the quiescent condition is conducting.

6 Claims, 1 Drawing Figure

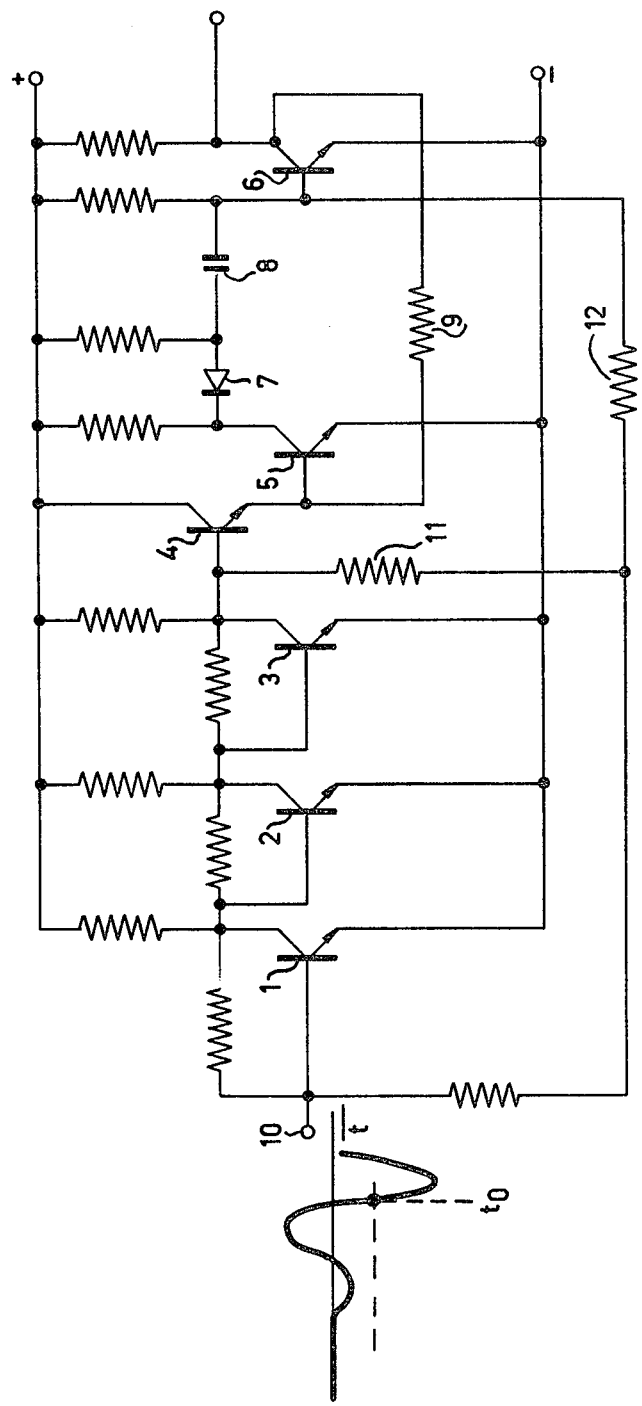

VOLTAGE SENSITIVE TRIGGER CIRCUIT

This is a continuation of application Ser. No. 574,511, filed May 5, 1975, now abandoned.

The invention relates to a voltage sensitive trigger circuit, which comprises a preamplifier and two cross-coupled alternately conducting trigger transistors, the trigger circuit changing over its conducting state when the input voltage exceeds a certain threshold level. Such trigger circuits are for example used for control purposes in which an input voltage is applied to the base of the one transistor of a differential amplifier, while a reference voltage is fed to the base of the other transistor of said differential amplifier in such a manner that, if the input voltage exceeds the reference voltage value, a trigger stage which is coupled to said differential amplifier changes state. A problem associated therewith is that the threshold voltage at which the trigger stage changes state should be very stable and should not vary with supply voltage and temperature variations respectively.

It is an object of the invention to provide a circuit arrangement which meets said requirement and the invention is characterized in that from the base of that trigger transistor which conducts in the quiescent condition, a voltage is derived which, together with the voltage at the output of the preamplifier, is applied to the input of said preamplifier in such a way that the quiescent voltage which is applied from the output of the preamplifier to the input of that trigger transistor which is non-conducting in the quiescent condition, experiences a threshold value which is compensated for temperature and supply voltage variations.

The invention will now be described with reference to the drawing, which shows an embodiment of the invention.

The circuit arrangement shown in the Figure comprises a preamplifier which consists of the cascaded transistors 1, 2 and 3 whose output, via a level-shifting transistor 4, is coupled to a trigger stage which consists of the transistors 5 and 6. The collectors and bases of transistors 5 and 6 are cross-coupled via circuits 7, 8 and 9 respectively. The circuit 7, 8 consists of a diode 7 and a capacitor 8 and the circuit 9 of a resistor so that a monostable trigger action is obtained. The transistor 6 is conducting in the quiescent condition and the transistor 5 is non-conducting. When the voltage at the base of the transistor 5 exceeds a certain threshold value, said transistor will be turned on so that the transistor 6 is turned off owing to the feedback via the circuits 7, 8 and 9, and a pulse appears at the collector of transistor 6. After same time, which is determined by the value of the capacitor 8 and the resistors connected to said capacitor, the voltage at the base of the transistor 6 will increase so far that said transistor is turned on and the trigger stage is reset to its previous state.

The input signal is applied to an input terminal 10 which is connected to the base of transistor 1. Said input signal is as shown in the Figure, an essential requirement being that when the input voltage (in a negative sense) exceeds a very accurately defined threshold level, the trigger is changed over, i.e. the said pulse is produced at the collector output of the transistor 6. According to the invention this is achieved in that both the collector output of the transistor 3 and the base of the transistor 6 are connected to the base input of the transistor 1 via resistors 11 and 12 respectively. This has the following result.

In the quiescent condition the transistor 6 is driven into conduction to such an extent that it is bottomed (i.e. the collector current no longer increases for increasing base current). The voltage which then develops between the base and the emitter of the transistor 6 then not only varies with temperature, but is also linearly dependent on the supply voltage. For example, the transistor 1 is biassed so as to obtain a quiescent current which is 10x smaller, so that said transistor operates in its linear amplification range and is far from being saturated. The voltage which is then produced between its base and emitter is again temperature dependent, but owing to inter alia the use of negative feedback it is hardly dependent on the supply voltage. However, without negative feedback, supply voltage variations will appear at the collector of the transistor 3. Negative feedback alone can reduce said variations but cannot eliminate them. An appropriate choice of resistors 11 and 12 not only ensures that negative feedback is applied to the base of transistor 1 via the resistor 11, but also an additional current via the resistor 12, which current compensates for the supply voltage variations at the collector of the transistor 3. Thus, the effect of temperature variations is also compensated because both of the transistors 1 and 6, which are conducting in the quiescent condition, exhibit an emitter-base voltage which varies with temperature in the same sense. In this manner, it is possible to compensate the threshold voltage, which acts at the base of the transistor 4, for both effects. It is obvious that it is also possible to obtain a certain undercompensation or overcompensation for supply voltage variations, which is sometimes desirable in view of the supply voltage dependence of the further circuitry that follows.

The circuit arrangement now operates as follows: if the input voltage exceeds the threshold voltage, which is indicated by a dashed line in a negative direction, the transistor 1 becomes less conducting to such an extent that upon amplification in the transistors 2 and 3, the collector voltage of the transistor 3 will have increased so far that the threshold value defined by the series of base-emitter paths of the transistors 4 and 5 is exceeded, whereupon the trigger stage 5, 6 switches over. The resultant output pulse at the collector of the transistor 6 appears exactly at the very instant at which the input signal exceeds the threshold value.

What is claimed is:

1. A voltage sensitive trigger circuit which comprises a preamplifier and two cross-coupled alternately conducting trigger transistors biased to a quiescent state, the trigger circuit changing its conducting state when the input voltage exceeds a specific threshold level, means for deriving a first voltage from the base of that trigger transistor which conducts in the quiescent stage, means for deriving a second voltage at the output of the preamplifier, means for applying said first and second voltages to the input of said preamplifier in such a way that the quiescent voltage which is applied from the output of the preamplifier to the input of that trigger transistor which is non-conducting in the quiescent state experiences a threshold value which is compensated for temperature and supply voltage variations.

2. A trigger circuit as claimed in claim 1 wherein said preamplifier includes a first amplifier stage biased into conduction in the quiescent state of the trigger circuit and having a control electrode serving as the preamplifier input, the two trigger transistors comprising a first transistor biased into cut-off and a second transistor biased into heavy conduction in the quiescent state of the trigger circuit, the preamplifier including means coupling the output of said first amplifier stage to the input of the first transistor, said first voltage being derived at the base of the second transistor.

3. A trigger circuit as claimed in claim 2 wherein said first and second transistors are connected to form a monostable multivibrator and including means for biasing the multivibrator into said quiescent state.

4. A trigger circuit as claimed in claim 2 wherein said preamplifier coupling means includes a second amplifier stage, and wherein said means for applying said first and second voltages to the preamplifier input comprises a first negative feedback circuit coupling the output of the second amplifier stage to the preamplifier input and a second feedback circuit coupling the base of said second transistor to the preamplifier input.

5. A trigger circuit as claimed in claim 4 wherein said first and second feedback circuits comprise first and second resistors, respectively, and further comprising a diode and a capacitor serially connected between the collector of the first transistor and the base of the second transistor and a third resistor connected between the collector of the second transistor and the base of the first transistor whereby said first and second cross-coupled transistors form a monostable multivibrator.

6. A trigger circuit as claimed in claim 1 wherein said preamplifier includes a first amplifier stage having a control electrode serving as the preamplifier input, the two trigger transistors comprising first and second transistors biased into cut-off and conduction, respectively, in the quiescent state of the trigger circuit, the preamplifier including a second amplifier stage coupling the output of the first amplifier stage to the input of the first transistor, and wherein said means for applying said first and second voltages to the preamplifier input comprises first and second feedback circuits connected between the output of the second amplifier stage and the preamplifier input and between the base of the second transistor and the preamplifier input, respectively.

\* \* \* \* \*

UNITED STATES PATENT AND TRADEMARK OFFICE
CERTIFICATE OF CORRECTION

PATENT NO. : 4,034,241
DATED : July 5, 1977
INVENTOR(S) : CORNELIS MARTINUS VAN DER BURGT ET AL It is certified that error appears in the above-identified patent and that said Letters Patent are hereby corrected as shown below:

<u>IN THE SPECIFICATION</u>

Col. 2, line 56 "stage" should be --state--.

Signed and Sealed this

Thirtieth Day of October 1979

[SEAL]

Attest:

RUTH C. MASON
*Attesting Officer*

LUTRELLE F. PARKER
*Acting Commissioner of Patents and Trademarks*